(12) United States Patent
Campbell

(10) Patent No.: US 8,238,146 B2
(45) Date of Patent: Aug. 7, 2012

(54) VARIABLE INTEGRATED ANALOG RESISTOR

(75) Inventor: Kristy A. Campbell, Boise, ID (US)

(73) Assignee: Boise State University, Boise, ID (US)

( * ) Notice: Subject to any disclaimer, the term of this patent is extended or adjusted under 35 U.S.C. 154(b) by 131 days.

(21) Appl. No.: 12/534,818

(22) Filed: Aug. 3, 2009

(65) Prior Publication Data

US 2010/0027324 A1    Feb. 4, 2010

Related U.S. Application Data

(60) Provisional application No. 61/137,641, filed on Aug. 1, 2008.

(51) Int. Cl.
*G11C 11/00* (2006.01)
(52) U.S. Cl. .......................... 365/159; 365/148
(58) Field of Classification Search .................. 365/148, 365/159
See application file for complete search history.

(56) References Cited

U.S. PATENT DOCUMENTS

| | | | |
|---|---|---|---|
| 6,646,902 B2 | 11/2003 | Gilton et al. |
| 6,784,018 B2 | 8/2004 | Campbell et al. |
| 6,812,087 B2 | 11/2004 | Giltom et al. |
| 6,813,176 B2 | 11/2004 | Gilton et al. |
| 6,813,178 B2 | 11/2004 | Campbell et al. |
| 6,849,868 B2 | 2/2005 | Campbell |
| 6,856,002 B2 | 2/2005 | Moore et al. |
| 6,861,367 B2 | 3/2005 | Gilton et al. |
| 6,864,521 B2 | 3/2005 | Moore et al. |
| 6,867,064 B2 | 3/2005 | Campbell et al. |
| 6,867,114 B2 | 3/2005 | Moore et al. |
| 6,867,996 B2 | 3/2005 | Campbell et al. |
| 6,881,623 B2 | 4/2005 | Campbell et al. |
| 6,888,155 B2 | 5/2005 | Campbell |
| 6,891,749 B2 | 5/2005 | Campbell et al. |
| 6,912,147 B2 | 6/2005 | Campbell |
| 6,921,912 B2 | 7/2005 | Campbell |
| 6,930,909 B2 | 8/2005 | Moore et al. |
| 6,953,720 B2 | 10/2005 | Moore et al. |
| 6,955,940 B2 | 10/2005 | Campbell et al. |
| 6,956,761 B2 | 10/2005 | Campbell |
| 6,961,277 B2 | 11/2005 | Moore et al. |
| 6,998,697 B2 | 2/2006 | Campbell et al. |
| 7,015,494 B2 | 3/2006 | Campbell |
| 7,018,863 B2 | 3/2006 | Moore et al. |
| 7,030,405 B2 | 4/2006 | Campbell |
| 7,050,327 B2 | 5/2006 | Campbell |
| 7,056,762 B2 | 6/2006 | Moore et al. |
| 7,061,004 B2 | 6/2006 | Campbell |

(Continued)

OTHER PUBLICATIONS

Ande, H.K., "A new approach to the design, fabrication, and testing of chalcogenide-based multi-state phase-change nonvolatile memory", "Circuits and Systems", Aug. 10, 2008, pp. 570-573, Published in: US.

(Continued)

*Primary Examiner* — Hoai V Ho
(74) *Attorney, Agent, or Firm* — Parsons Behle & Latimer

(57) ABSTRACT

The invention relates to the use of chalcogenide devices exhibiting negative differential resistance in integrated circuits as programmable variable resistor components. The present invention is a continuously variable integrated analog resistor made of a chalcogenide material, such as a GeSeAg alloy. Continuously variable resistor states are obtained in the material via application of an electrical pulse to it. The pulse sequence, duration and applied potential determine the value of the resistance state obtained.

20 Claims, 2 Drawing Sheets

U.S. PATENT DOCUMENTS

| | | | |
|---|---|---|---|
| 7,064,080 B2 | 6/2006 | Gilton et al. |
| 7,067,348 B2 | 6/2006 | Campbell et al. |
| 7,087,454 B2 | 8/2006 | Campbell et al. |
| 7,087,919 B2 | 8/2006 | Campbell et al. |
| 7,105,864 B2 | 9/2006 | Campbell et al. |
| 7,151,273 B2 | 12/2006 | Campbell et al. |
| 7,153,721 B2 | 12/2006 | Campbell |
| 7,163,837 B2 | 1/2007 | Moore et al. |
| 7,190,048 B2 | 3/2007 | Campbell |
| 7,220,982 B2 | 5/2007 | Campbell |
| 7,223,627 B2 | 5/2007 | Moore et al. |
| 7,274,034 B2 | 9/2007 | Campbell et al. |
| 7,277,313 B2 | 10/2007 | Campbell et al. |
| 7,282,783 B2 | 10/2007 | Campbell |
| 7,288,784 B2 | 10/2007 | Moore et al. |
| 7,289,349 B2 | 10/2007 | Campbell et al. |
| 7,294,527 B2 | 11/2007 | Campbell et al. |
| 7,304,368 B2 | 12/2007 | Campbell |
| 7,315,465 B2 | 1/2008 | Campbell et al. |
| 7,317,200 B2 | 1/2008 | Campbell |
| 7,317,567 B2 | 1/2008 | Campbell |
| 7,326,950 B2 | 2/2008 | Campbell |
| 7,329,558 B2 | 2/2008 | Campbell |
| 7,332,735 B2 | 2/2008 | Campbell |
| 7,344,946 B2 | 3/2008 | Moore et al. |
| 7,348,205 B2 | 3/2008 | Campbell et al. |
| 7,348,209 B2 | 3/2008 | Campbell |
| 7,354,793 B2 | 4/2008 | Campbell |
| 7,365,411 B2 | 4/2008 | Campbell |
| 7,366,030 B2 | 4/2008 | Campbell et al. |
| 7,385,868 B2 | 6/2008 | Moore et al. |
| 7,387,909 B2 | 6/2008 | Campbell |
| 7,393,798 B2 | 7/2008 | Campbell |
| 7,396,699 B2 | 7/2008 | Campbell et al. |
| 7,433,227 B2 | 10/2008 | Campbell et al. |
| 7,459,764 B2 | 12/2008 | Moore et al. |
| 7,491,962 B2 | 2/2009 | Liu et al. |
| 7,518,212 B2 | 4/2009 | Moore et al. |
| 7,542,319 B2 | 6/2009 | Campbell et al. |
| 7,550,818 B2 | 6/2009 | Moore et al. |
| 7,579,615 B2 | 8/2009 | Daley et al. |
| 7,586,777 B2 | 9/2009 | Campbell |
| 7,609,563 B2 | 10/2009 | Campbell et al. |
| 7,619,247 B2 | 11/2009 | Moore et al. |
| 7,646,007 B2 | 1/2010 | Campbell et al. |
| 7,659,205 B2 | 2/2010 | Campbell |
| 7,663,137 B2 | 2/2010 | Campbell |
| 7,682,992 B2 | 3/2010 | Campbell |
| 7,692,177 B2 | 4/2010 | Moore et al. |
| 7,701,760 B2 | 4/2010 | Campbell et al. |
| 7,709,885 B2 | 5/2010 | Daley et al. |
| 7,723,713 B2 | 5/2010 | Campbell et al. |
| 7,745,808 B2 | 6/2010 | Campbell |
| 7,749,853 B2 | 7/2010 | Campbell |
| 7,759,665 B2 | 7/2010 | Campbell |
| 7,785,976 B2 | 8/2010 | Campbell |
| 2003/0047765 A1 | 3/2003 | Campbell |
| 2003/0143782 A1 | 7/2003 | Gilton et al. |
| 2003/0146427 A1 | 8/2003 | Campbell |
| 2004/0202016 A1* | 10/2004 | Campbell ............... 365/159 |
| 2004/0211957 A1 | 10/2004 | Moore et al. |
| 2004/0223390 A1 | 11/2004 | Campbell et al. |
| 2005/0247927 A1 | 11/2005 | Campbell |
| 2005/0286294 A1 | 12/2005 | Campbell |
| 2006/0045974 A1 | 3/2006 | Campbell et al. |
| 2006/0131555 A1 | 6/2006 | Liu et al. |
| 2007/0145463 A1 | 6/2007 | Campbell |
| 2007/0158631 A1 | 7/2007 | Daley et al. |
| 2007/0218583 A1 | 9/2007 | Farnworth et al. |
| 2008/0067489 A1 | 3/2008 | Campbell |
| 2008/0121859 A1 | 5/2008 | Campbell |
| 2008/0164456 A1 | 7/2008 | Campbell |
| 2008/0185574 A1 | 8/2008 | Campbell et al. |
| 2008/0188034 A1 | 8/2008 | Campbell |
| 2008/0237563 A1 | 10/2008 | Campbell |
| 2008/0253167 A1* | 10/2008 | Symanczyk ............... 365/148 |
| 2009/0124041 A1 | 5/2009 | Liu et al. |
| 2009/0201716 A1* | 8/2009 | Ufert ............... 365/148 |
| 2009/0275198 A1* | 11/2009 | Kamepalli et al. ............ 438/659 |
| 2010/0027324 A1 | 2/2010 | Campbell |

OTHER PUBLICATIONS

Britt et al, "Pulsed and Parallel-Polarization EPR Characterization of the Photosystem II Oxygen-Evolving Complex", "Annual Review of Biophysics and Biomolecular Structure", Jun. 1, 2000, pp. 463-495, vol. 29, Published in: US.

Britt et al, "Recent Pulsed EPR Studies of the Photosystem II Oxygen Evolving Complex: Implications as to Water Oxidation Mechanisms", "Biochimica et Biophysica Acta", Apr. 12, 2004, pp. 158-171, vol. 1655, No. 1-3, Published in: NL.

Campbell, et al, "Dual-Mode EPR Detects the Initial Intermediate in Photoassembly of the Photosystem II Mn Cluster the Influence of Ami", "Journal of the American Chemical Society", Mar. 30, 2000, pp. 3754-3761, vol. 122, No. 15, Published in: US.

Campbell, et al, "Parallel Polarization EPR Detection of an S1-State Multiline EPR Signal in Photosystem II Particles from Synechocystis", "Journal of the American Chemical Society", Jan. 6, 1998, pp. 447-448, vol. 120, No. 2, Published in: US.

Campbell, Kristy A., et al, "Phase-change memory devices with stacked Ge-chalcogenide/Sn-chalcogenide layers", "Microelectronics Journal", Jan. 1, 2007, pp. 52-59, vol. 38, No. 1, Published in: US.

Campbell, "Characterization of Sn, Zn, In, and Sb-containing GeSe alloys for phase-change electronic memory applications", "Materials Research Society Symposium Proceedings", Apr. 9, 2007, vol. 997, Published in: US.

Campbell, et al, "Chalcogenide bilayer materials used to create multi-state resistance variable devices","Abstracts, 62nd Northwest Regional Meeting of the American Chemical Society", Jun. 17, 2007, vol. NW-234, Publisher: American Chemical Society, Published in: US.

Campbell et al, "Parallel Polarization EPR Characterization of the Mn(III) Center of Oxidized Manganese Superoxide Dismutase", "Journal of the American Chemical Societ", May 1, 1999, pp. 4714-4715, vol. 121, No. 19, Published in: US.

Campbell et al, "The t-Nitrogen of D2 Histidine 189 is the Hydrogen Bond Donor to the Tyrosine Radical YD of Photosystem II", "J. Am. Chem. Soc", Feb. 25, 1997, pp. 4787-4788, vol. 119, No. 20, Published in: US.

Campbell et al, "Dual-Mode EPR Study of Mn(III) Salen and the Mn(III) Salen-Catalyzed Epoxidation of cis-B-Methylstyrene", "Journal of the American Chemical Society", May 26, 2001, pp. 5710-5719, vol. 123, No. 24, Published in: US.

Campbell et al, "The 23 and 17 kDa Extrinsic Proteins of Photosystem II Modulate the Magnetic Properties of the S1-State Manganese Cluste", "Biochemistry", Mar. 21, 1998, pp. 5039-5045, vol. 37, No. 15, Published in: US.

Campbell et al, "Phase-change memory devices with stacked Ge-chalcogenide/Sn-chalcogenide layers", "Microelectronics Journal", Nov. 14, 2006, pp. 52-59, vol. 38, No. 1, Published in: US.

Davis, et al, "Synthesis and characterization of metal-doped chalcogenide glasses", "Abstracts, 62nd Northwest Regional Meeting of the American Chemical Society", Jun. 17, 2007, vol. NW-039, Publisher: American Chemical Society, Published in: US.

Debus, Richard J., et al, "Does Histidine 332 of the D1 Polypeptide Ligate the Manganese Cluster in Photosystem II? An Electron Spin Echo Envelope", "Biochemistry", Feb. 27, 2001, pp. 3690-3699, vol. 40, No. 12.

Debus et al, "Does Aspartate 170 of the D1 Polypeptide Ligate the Manganese Cluster in Photosystem II? An EPR and ESEEM Study", "Biochemistry", Aug. 21, 2003, pp. 10600-10608, vol. 42, No. 36, Published in: US.

Debus, Richard J., et al, "Glutamate 189 of the D1 Polypeptide Modulates the Magnetic and Redox Properties of the Manganese Cluster and Tyrosine YZ", "Biochemistry", May 6, 2000, pp. 6275-6287, vol. 39, No. 21, Publisher: American Chemical Society.

Debus, Richard J., et al, "Histidine 332 of the D1 Polypeptide Modulates the Magnetic and Redox Properties of the Manganese Cluster and Tyrosine Yz", "Biochemistry", Dec. 8, 1999, pp. 470-478, vol. 39, No. 2, Publisher: American Chemical Society.

Devasia et al, "Influence of Sn Migration on phase transition in GeTe and Ge2Se3 thin films", "Applied Physics Letters", Apr. 9, 2010, pp. 141908, vol. 96, Published in: US.

Devasia et al, "Analyzing residual stress in bilayer chalcogenide Ge2Se3/SnTe films", "Thin Solid Films", Apr. 8, 2009, pp. 6516-6519, vol. 517, No. 24, Published in: US.

Gupta et al, "W-2W Current Steering DAC for Programming Phase Change Memory", Apr. 3, 2009, pp. 1-4, Publisher: WMED 2009. IEEE Workshop on Apr. 3, 2009, Published in: US.

Campbell et al, "Parallel Polarization EPR Characterization of the Mn(III) Center of Oxidized Manganese Superoxide Dismutase", "Journal of the American Chemical Society", May 1, 1999, pp. 4714-4715, vol. 121, Published in: US.

Peloquin, Jeffrey M., et al, "55Mn Pulsed ENDOR Demonstrates That the Photosystem II Split EPR Signal Arises from a Magnetically-Coupled Mangano-Tyrosyl Complex", "Journal of the American Chemical Society", Jun. 27, 1998, pp. 6840-6841, vol. 120, No. 27, Publisher: American Chemical Society.

Peloquin, Jeffrey M., et al, "55Mn ENDOR of the S2-State Multiline EPR Signal of Photosystem II Implications on the structure of the Tetranuclear Mn", "Journal of the American Chemical Society", Oct. 21, 2000, pp. 10926-10942, vol. 122, No. 44, Publisher: American Chemical Society.

Rapole et al, "Resistive Memory Sensing Using Delta-Sigma Modulation", Apr. 3, 2009, Publisher: WMED 2009. IEEE Workshop on Apr. 3, 2009, Published in: US.

Regner et al, "Integration of IC Industry Feature Sizes with University Back-End-of-Line Post Processing: Example Using a Phase-Change", Apr. 3, 2009, pp. 1-4, Publisher: WMED 2009. IEEE Workshop on Apr. 3, 2009, Published in: US.

Oblea, Antonio S., et al, "Silver Chalcogenide Based Memristor Devices", Jul. 19, 2010, Publisher: IEEE World Congress on Computational Intelligence.

Oblea et al, "Memristor Spice Model Simulation & Device Hardware Correlation", May 6, 2010, Publisher: IEEE, Published in: US.

Edwards, Arthur H., et al, "Density Functional Study of Ag in Ge2Se3", Oct. 25, 2009, pp. 1-7, Publisher: Non-Volatile Memory Technology Symposium, Published in: US.

Pino, Robinson E., et al, "Compact Method for Modeling and Simulation of Memristor Devices", Jun. 17, 2010, pp. 1-7, Publisher: 2010 IEEE/ACM International Symposium on Nanoscale Architectures (NANOARCH).

* cited by examiner

VARIABLE INTEGRATED ANALOG RESISTOR

This application claims priority of Provisional Application Ser. No. 61/137,641, filed Aug. 1, 2008, the entire disclosure of which is incorporated herein by this reference.

BACKGROUND OF THE INVENTION

1. Field of the Invention

This invention relates generally to integrated circuits, and more specifically to an integrated, on-chip resistor with a range of available, different resistance states. Also, this invention pertains to electronically programmable analog variable resistors and circuits using devices exhibiting electrically programmable, different resistances.

2. Related Art

In the current state of the art, there are no integrated circuit resistor elements that are programmable. In an integrated circuit, resistors are typically fabricated in silicon by doping the silicon to a level that fixes the material resistance. This resistance is unchangeable and irreversible in the final integrated circuit. Another way of achieving a resistance in an integrated circuit is by biasing a transistor, such as a MOSFET, at certain conditions. This technique requires constant power and is thus not a low-power, or no-power, passive resistance. With neither technique is it possible to create a range of available resistance states during integrated circuit operation, referred to as variable resistances, which retain their state in the absence of an applied electrical signal.

The lack of available passive variable resistor components prevents certain basic circuit functions that require analog or programmable resistors at the chip level. On-chip integrated, programmable analog resistors would enable, for example, field-programmable circuitry, reconfigurable electronics, reduction in size of the associated circuit electronics, and lower power operation.

Chalcogenide glasses containing an excess of metal ions, e.g. Ag ions, have been shown to exhibit negative differential resistance (NDR). In this context, NDR is the same as differential negative resistance (DNR)—referred to in the prior art. U.S. Pat. Nos. 7,329,558, 7,050,327, and 7,015,494 describe devices displaying NDR/DNR, using these devices in binary electronic memory, and as an analog memory via the current value read at the NDR peak. In the prior art, the NDR device is formed by addition of an excess of metal ions in a chalcogenide glass by either heating a chalcogenide material layered with a metal layer or by application of a fast electrical pulse with pulse width and amplitude specific to the chalcogenide material type. The peak current is programmed by application of a pulse of duration and amplitude that can cause the peak current to be either reduced or increased. The device current is read at or near the voltage corresponding to the peak current value.

NDR devices can be fabricated with standard complementary metal-oxide semiconductor (CMOS) processes at sizes consistent with the state of the art feature sizes, thus integrating well with existing and future integrated circuit technologies. Conventional chalcogenide devices may be comprised of $Ge_xSe_{1-x}$, wherein $0 \leq x \leq 0.9$. Some chalcogenide devices contain copper and/or silver and/or mixtures thereof. For example, chalcogenide devices may comprise any combination of $(Ge_xSe_{1-x})_yCu_{1-y}$ and $(Ge_xSe_{1-x})_yAg_{1-y}$, wherein $0 \leq x \leq 0.9$ and wherein $0.1 \leq y \leq 0.9$. Also, some chalcogenide devices are of a single layer of chalcogenide material containing an excess of metal which causes the NDR response. Chalcogenide devices exhibiting NDR can be used as continuously variable resistors by programming with material specific pulse conditions, and using the resistance of the device measured between 0V (zero volts) and the potential corresponding to the NDR peak current in an integrated circuit. The pulse conditions applied to the chalcogenide device determine the resistance value obtained. The typical range of resistance values is semi-continuous, and thus analog, within the MOhm range to the Ohm range.

U.S. Pat. No. 7,015,494 (Campbell '494) discloses an integrated device, for example, a tunnel diode, displaying differential negative resistance (DNR)—an operating region in which Ohm's classic relation between current and voltage (I=V/R) does not apply. The '494 device is a layered semiconductor construction on a substrate, the layers being:

1. Ge and one or more of S, Te and Se;
2. a transition metal and one of more of O, S, Te and Se; and,
3. Ge and one or more of S, Te and Se.

The disclosure of the '494 patent, invented by the subject inventor, is incorporated herein by reference.

U.S. Pat. No. 7,050,327 (Campbell '327) discloses a DNR memory device that can be programmed to store information as readable current amplitudes. The memory device is made of the material disclosed in the '494 patent, and the stored data is semi-volatile. The disclosure of the '327 patent, invented by the subject inventor, is also incorporated herein by reference.

SUMMARY OF THE INVENTION

The invention relates to the use of chalcogenide devices exhibiting NDR in integrated circuits as programmable variable resistor components. The present invention is a variable integrated resistor made of a chalcogenide material, such as a GeSeAg alloy. Variable resistor states are obtained in the material via application of an electrical pulse to it. The pulse sequence, duration and applied potential determine the value of the resistance state obtained.

DETAILED DESCRIPTION OF THE INVENTION

Referring to the figures, there are shown several, but not the only, embodiments of the invented device.

Figure 1:
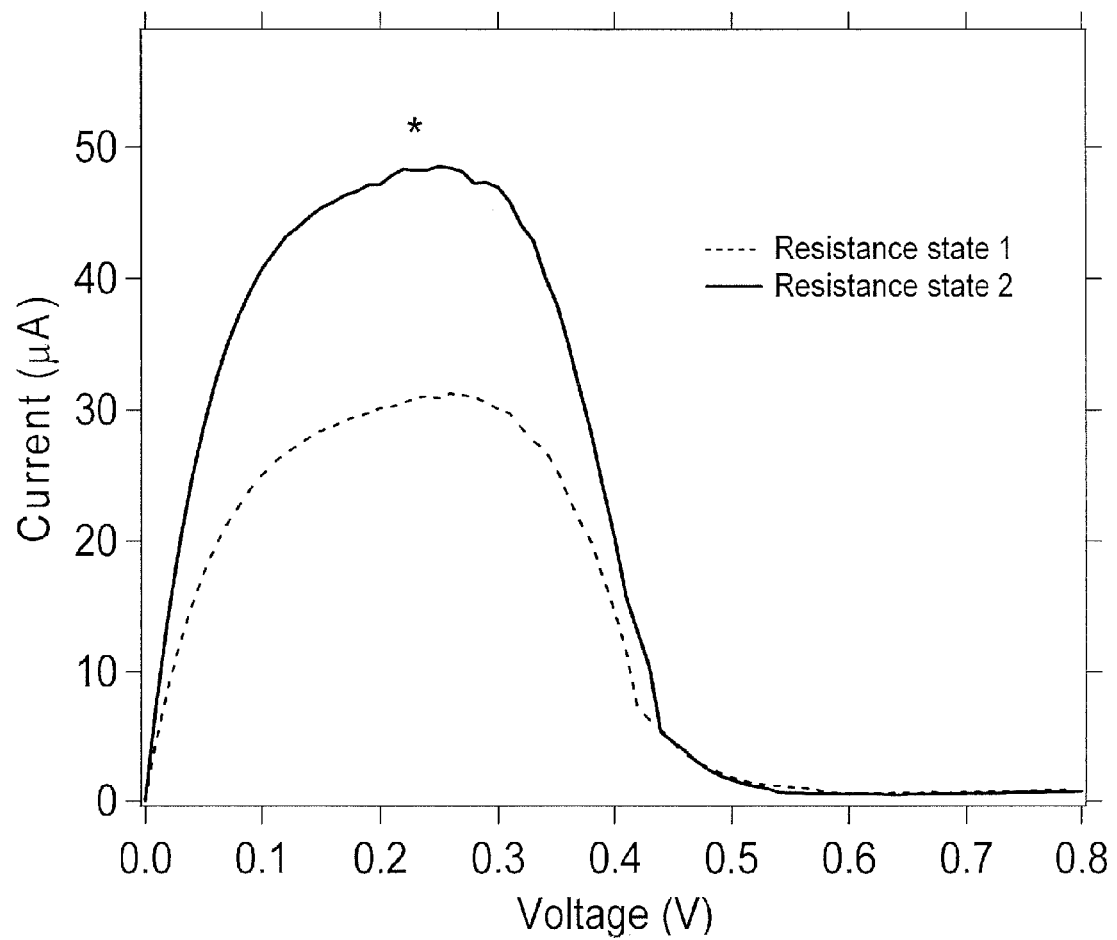
FIG. 1 is a graph of current vs. voltage for 2 different resistance states for one embodiment of the invention. For FIG. 1, a GeSeAg device is programmed into two different resistance states, as measured at the peak current voltage of approximately 0.25 V (denoted by the asterisk in FIG. 1).

Two-terminal electronic devices fabricated with chalcogenide materials alloyed with metals such as Sn, Ag, and Cu, can be forced, via application of an electrical pulse, to operate in a mode whereby they exhibit a negative differential resistance (NDR) I-V response. This has previously been explored for application in non-volatile memory in U.S. Pat. No. 7,050, 327, discussed above. FIG. 1 shows an NDR I-V curve measured from a device consisting of a conventional $Ge_xSe_ySn_z$ Ag alloy. This device, with a diameter of 0.13 um, has been forced into an NDR mode by application of a short electrical pulse (<10 ns) with an amplitude less than 1 V. This device that has been forced into NDR can operate as a continuously variable resistor when the resistance value is measured at approximately 0.25 V, the potential at which the peak current is measured (denoted by the * in FIG. 1).

The resistance of an NDR device can be programmed by the application of a sequence of short electrical pulses. The amplitude of the pulses and the number of pulses will determine the programmed resistance state. FIG. 1 shows the IV response of a device programmed into two different resistance states. Resistance state 2 (FIG. 1, solid curve) was achieved by pulsing the device in Resistance state 1 (FIG. 1 dotted curve) with 5 additional 400 mV, 8 ns pulses. Further pulsing can cause the device to achieve resistances as low as 500 Ohms and as high as 10's of MOhms. The devices can be switched from lower to higher resistances by varying the amplitude of the pulse applied.

Figure 2:
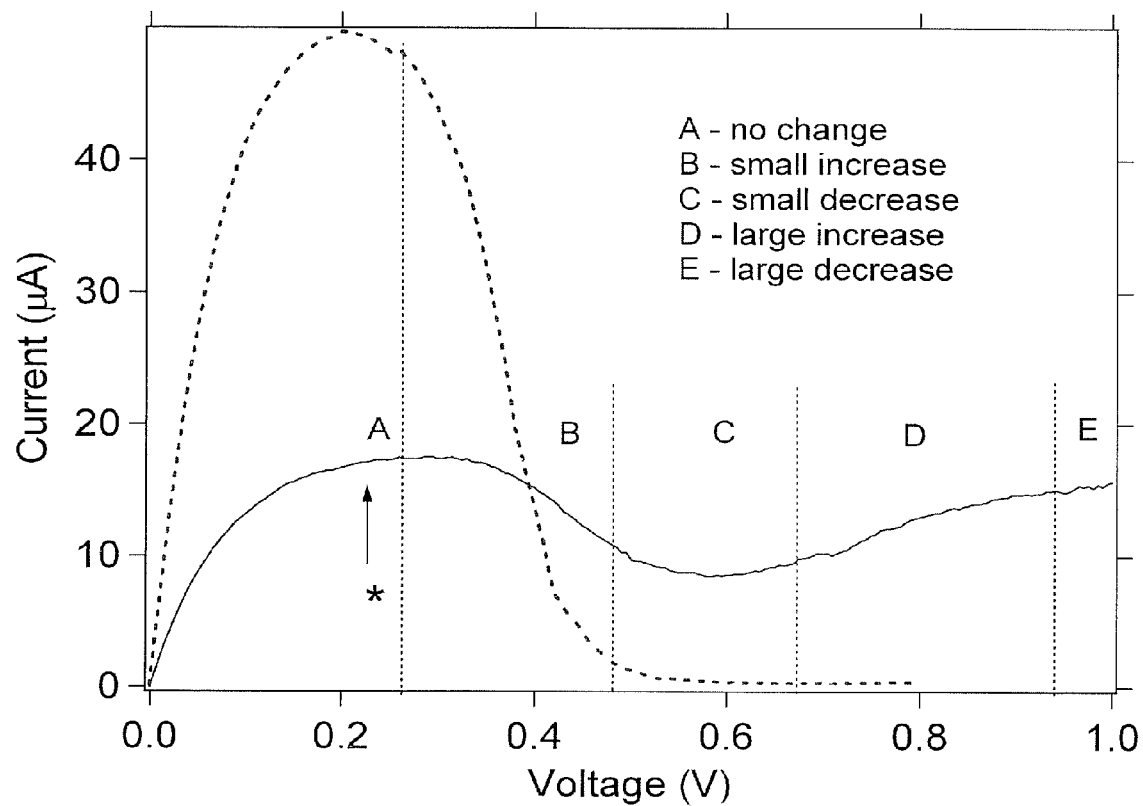
FIG. 2 is a graph of current vs. voltage for 2 different devices programmed according to different embodiments of the invention. For FIG. 2, the potential regions A-E that are used to program the device resistance to higher or lower values are shown. I-V curves for the two devices in different resistance states (as measured at 0.25 V, denoted by asterisk) are shown in the dashed and solid traces.

The influence of the pulse amplitude on the increase or decrease of the resistance is illustrated in FIG. 2. When a pulse with a potential value corresponding to a value in region A in FIG. 2 is applied to the conventional NDR device, the current measured at 0.25 V does not change. Thus, application of a pulse with a potential in region A can be used to 'read' the resistance without disturbing it. When a pulse with a potential in region B is applied to the NDR device, the current measured at 0.25 V increases by a small amount (<20%). However, when a potential in region D is applied to the device, the absolute current amplitude at 0.25 V increases significantly (>80%), corresponding to a significant decrease in resistance. Potentials applied to the bit with amplitudes in region C and E cause the peak current to decrease by a small amount (<20%) and a significant amount (>80%), respectively. Thus to cause a low resistance device to switch to a very high resistance device, a pulse with a potential greater than 1 V must be applied. Additionally, multiple pulses applied in each potential region have a cumulative effect on the peak current at 0.25 V. In other words, 10 pulses applied in potential region B may increase the peak current amplitude at 0.25 V by as much as one pulse applied in region D.

Although this invention will be described in terms of certain preferred embodiments, other embodiments will be apparent to those of ordinary skill in the art, including embodiments that do not provide all of the benefits and features set forth herein, and are also within the scope of this invention. It is to be understood that other embodiments may be utilized, and that many circuits that utilize the concept of this programmable resistor can be designed and fabricated, including those that optimize the programming of and the use of the programmable resistor, without departing from the spirit and scope of the present invention.

Although this invention has been described above with reference to particular means, materials and embodiments, it is to be understood that the invention is not limited to these disclosed particulars, but extends instead to all equivalents within the broad scope of the following claims.

The invention claimed is:

1. A method of inducing a programmable resistance in a chalcogenide device exhibiting negative differential resistance wherein the chalcogenide device is an analog variable resistor, the method comprising:
configuring the analog variable resistor to change resistance states in response to electrical pulses, where the pulses fall within at least four possible voltage potential ranges corresponding to at least (1) a small decrease in resistance, (2) a small increase in resistance, (3) a large decrease in resistance, and (4) a large increase in resistance,
wherein possible voltage potential ranges (2) and (4) are related such that at least approximately five electrical pulses in possible voltage potential range (2) cause a resistance change equivalent to approximately one pulse in possible voltage potential range (4), and
further wherein possible voltage potential ranges (1) and (3) are related such that at least approximately five electrical pulses in possible voltage potential range (1) cause a resistance change equivalent to approximately one pulse in possible voltage potential range (3); and
applying an electrical pulse to the chalcogenide device, wherein the electrical pulse falls within one of the at least four possible voltage potential ranges.

2. The method of claim 1 wherein:
inducing a small decrease in resistance comprises pulsing with approximately 0.27 V to approximately 0.47 V;
inducing a small increase in resistance comprises pulsing with approximately 0.47 V to approximately 0.65 V;
inducing a large decrease in resistance comprises pulsing with approximately 0.65 V to approximately 0.92 V; and
inducing a large increase in resistance comprises pulsing with approximately 0.92 V and greater.

3. The method of claim 1 further comprising reading the programmable resistance of the chalcogenide device with an electric pulse between 0 V and the chalcogenide device's negative differential resistance peak voltage value.

4. The method of claim 3 where the electric read pulse is approximately 0.25 V.

5. An analog variable resistor comprising:
a chalcogenide material exhibiting negative differential resistance; and
wherein the analog variable resistor is configured to change resistance states in response to pulses within at least four voltage potential ranges, the at least four voltage potential ranges comprising:
a first voltage potential range, the first voltage potential range inducing a small decrease in resistance;
a second voltage potential range, the second voltage potential range inducing a small increase in resistance;
a third voltage potential range, the third voltage potential range inducing a large decrease in resistance; and
a fourth voltage potential range, the fourth voltage potential range inducing a large increase in resistance; and
wherein the second and fourth possible voltage potential ranges are related such that at least approximately five electrical pulses in the second possible voltage potential range cause a resistance change equivalent to approximately one pulse in the fourth possible voltage potential range, and
further wherein the first and third possible voltage potential ranges are related such that at least approximately five electrical pulses in the first possible voltage potential range cause a resistance change equivalent to approximately one pulse in the third possible voltage potential range.

6. The analog variable resistor of claim 5 wherein the analog variable resistor is configured to have a range of resistivity between 500 Ohms and approximately 10 MOhms.

7. The analog variable resistor of claim 5 wherein the analog variable resistor has a diameter of approximately 0.13 μm.

8. The analog variable resistor of claim 5 wherein the analog variable resistor is programmable over at least ten resistance states.

9. The analog variable resistor of claim 5 wherein the chalcogenide material comprises a $Ge_xSe_ySn_zAg$ alloy.

10. The analog variable resistor of claim 5 wherein the chalcogenide material is configured to have a range of resistive values and the range of resistive values is continuous between 500 Ohms to approximately 10 MOhms.

11. The analog variable resistor of claim 5 wherein the chalcogenide material comprises $Ge_xSe_{1-x}$, where $0 \leq x \leq 0.9$.

12. The analog variable resistor of claim 5 wherein the chalcogenide material comprises Cu.

13. The analog variable resistor of claim 5 wherein the chalcogenide material comprises Ag.

14. The analog variable resistor of claim 11 wherein the chalcogenide material comprises a combination of $(Ge_xSe_{1-x})_yCu_{1-y}$ and $(Ge_xSe_{1-x})_yAg_{1-y}$, where $0.1 \leq y \leq 0.9$.

15. The method of claim 1 further comprising applying at least a second electrical pulse to the chalcogenide device.

16. The method of claim 1 further comprising applying a plurality of electrical pulses to induce a programmable resistance, wherein each of the plurality of electrical pulses falls within one of the at least four possible voltage potential ranges.

17. The method of claim 16 wherein the plurality of electrical pulses comprises at least five electrical pulses of approximately 400 mV, each electrical pulse having a duration of about 8 ns.

18. The method of claim 16 wherein the plurality of electrical pulses comprise at least two electrical pulses of approximately 800 mV, each electrical pulse having a duration of about 8 ns.

19. The method of claim 16 wherein the plurality of electrical pulses comprise at least live electrical pulses of approximately 600 mV, each electrical pulse having a duration of about 8 ns.

20. A method of inducing a programmable resistance in an on-chip integrated chalcogenide device comprising two terminals and a $Ge_xSe_ySn_zAg$ alloy, the method comprising:
  applying an electrical pulse to the on-chip integrated chalcogenide device and thereby forcing the on-chip integrated chalcogenide device into a negative differential state;
  applying a first plurality of additional electrical pulses of a first voltage potential to the on-chip integrated chalcogenide device, wherein the first voltage potential comprises a voltage potential between approximately 0.27 V and 0.47 V, further wherein each of the first plurality of additional electrical pulses comprises a duration of approximately less than 10 ns and is configured to cause a small decrease in resistance of the on-chip integrated chalcogenide device;
  applying a second plurality of additional electrical pulses of a second voltage potential to the on-chip integrated chalcogenide device, wherein the second voltage potential comprises a voltage potential between approximately 0.47 V and 0.65 V, further wherein each of the second plurality of additional electrical pulses comprises a duration of approximately less than 10 ns and is configured to cause a small increase in resistance of the on-chip integrated chalcogenide device;
  applying a third plurality of additional electrical pulses of a third voltage potential to the on-chip integrated chalcogenide device, wherein the third voltage potential, comprises a voltage potential between approximately 0.65 V and 0.92 V, further wherein each of the third plurality of additional electrical pulses comprises a duration of approximately less than 10 ns and is configured to cause a large decrease in resistance of the on-chip integrated chalcogenide device;
  applying a fourth plurality of additional electrical pulses of a fourth voltage potential to the on-chip integrated chalcogenide device, wherein the fourth voltage potential comprises a voltage potential between approximately 0.92 V and greater, further wherein each of the fourth plurality of additional electrical pulses comprises a duration of approximately less than 10 ns and is configured to cause a large increase in resistance of the on-chip integrated chalcogenide device;
  wherein the second and fourth voltage potentials are related such that at least approximately five electrical pulses of the second voltage potential cause a resistance change equivalent to approximately one pulse of the fourth voltage potential, and
  further wherein the first and third voltage potentials are related such that at least approximately five electrical pulses in the first voltage potential cause a resistance change equivalent to approximately one pulse of the third voltage potential.

* * * * *